United States Patent [19]
Chou

[11] Patent Number: 5,856,064
[45] Date of Patent: Jan. 5, 1999

[54] DRY PEEL-APART IMAGING OR PROOFING SYSTEM

[75] Inventor: Hsin-hsin Chou, Woodbury, Minn.

[73] Assignee: Minnesota Mining and Manufacturing Company, St. Paul, Minn.

[21] Appl. No.: 707,930

[22] Filed: Sep. 10, 1996

[51] Int. Cl.⁶ ........................................................ G06F 7/34
[52] U.S. Cl. .......................... 430/253; 430/257; 430/260; 430/273.1; 430/293.1
[58] Field of Search ..................................... 430/253, 257, 430/260, 273.1, 293

[56] References Cited

U.S. PATENT DOCUMENTS

| | | | |
|---|---|---|---|
| 3,060,024 | 10/1962 | Burg et al. | 96/28 |
| 3,136,637 | 6/1964 | Larson | 96/75 |
| 3,615,435 | 10/1971 | Chu et al. | 96/28 |
| 3,634,087 | 1/1972 | Houle et al. | 96/49 |
| 3,671,236 | 6/1972 | Beusekom | 96/15 |
| 4,050,936 | 9/1977 | Takeda et al. | 96/28 |
| 4,174,216 | 11/1979 | Cohen et al. | 430/257 |
| 4,175,964 | 11/1979 | Uchida et al. | 430/253 |
| 4,247,619 | 1/1981 | Cohen et al. | 430/253 |
| 4,249,011 | 2/1981 | Wendling | 548/312 |
| 4,262,072 | 4/1981 | Wendling et al. | 130/14 |
| 4,282,308 | 8/1981 | Cohen et al. | 430/271 |
| 4,286,043 | 8/1981 | Taylor, Jr. | 430/253 |
| 4,288,525 | 9/1981 | Shepherd et al. | 430/253 |
| 4,291,114 | 9/1981 | Berggren et al. | 430/253 |
| 4,304,836 | 12/1981 | Cheema et al. | 430/252 |
| 4,306,954 | 12/1981 | Wendling et al. | 204/159.22 |
| 4,323,591 | 4/1982 | Wendling et al. | 427/53.1 |
| 4,347,300 | 8/1982 | Shimazu et al. | 430/156 |
| 4,349,620 | 9/1982 | Cyr et al. | 430/259 |
| 4,482,625 | 11/1984 | Namiki et al. | 430/143 |
| 4,489,153 | 12/1984 | Ashcraft et al. | 430/253 |
| 4,489,154 | 12/1984 | Taylor, Jr. | 430/253 |
| 4,511,641 | 4/1985 | Busman et al. | 430/158 |
| 4,551,408 | 11/1985 | Mino et al. | 430/141 |
| 4,596,757 | 6/1986 | Barton et al. | 430/257 |
| 4,634,652 | 1/1987 | Barton | 430/156 |
| 4,650,738 | 3/1987 | Platzer et al. | 430/143 |
| 4,656,114 | 4/1987 | Cederberg et al. | 430/160 |
| 4,748,101 | 5/1988 | Barton | 430/160 |
| 4,751,166 | 6/1988 | Platzer et al. | 430/160 |
| 4,808,508 | 2/1989 | Platzer | 430/143 |
| 4,910,120 | 3/1990 | Platzer et al. | 430/253 |
| 4,923,780 | 5/1990 | Taylor, Jr. | 430/257 |
| 4,923,860 | 5/1990 | Simons | 503/227 |
| 4,929,532 | 5/1990 | Dunder | 430/143 |
| 4,952,482 | 8/1990 | Barton et al. | 430/325 |
| 4,962,081 | 10/1990 | Harrison et al. | 503/227 |
| 4,963,462 | 10/1990 | Wilczak | 430/143 |
| 4,965,242 | 10/1990 | DeBoer et al. | 503/227 |
| 4,975,410 | 12/1990 | Weber et al. | 503/227 |
| 4,987,051 | 1/1991 | Taylor, Jr. | 430/253 |
| 5,001,036 | 3/1991 | Choi | 430/271 |
| 5,008,174 | 4/1991 | Platzer | 430/143 |
| 5,073,534 | 12/1991 | Harrison et al. | 503/227 |
| 5,087,549 | 2/1992 | Peiffer | 430/253 |
| 5,156,938 | 10/1992 | Foley et al. | 430/200 |
| 5,166,126 | 11/1992 | Harrison et al. | 503/227 |
| 5,171,650 | 12/1992 | Ellis et al. | 430/20 |
| 5,234,790 | 8/1993 | Lang et al. | 430/253 |
| 5,248,583 | 9/1993 | Lundquist et al. | 430/263 |
| 5,256,506 | 10/1993 | Ellis et al. | 430/20 |
| 5,258,261 | 11/1993 | Heller | 430/273 |
| 5,278,023 | 1/1994 | Bills et al. | 430/201 |
| 5,300,399 | 4/1994 | Wilczak | 430/253 |
| 5,308,737 | 5/1994 | Bills et al. | 430/201 |
| 5,374,497 | 12/1994 | Kapusniak et al. | 430/254 |
| 5,374,780 | 12/1994 | Pazdirek | 174/176 |
| 5,409,799 | 4/1995 | Uytterhoeven et al. | 430/254 |

FOREIGN PATENT DOCUMENTS

| | | | |
|---|---|---|---|
| 0 096 572 A2 | 12/1983 | European Pat. Off. | |
| 0 115 446 A2 | 8/1984 | European Pat. Off. | |
| 0 323 191 A2 | 7/1989 | European Pat. Off. | |
| 0 365 356 | 4/1990 | European Pat. Off. | |
| 0 365 357 | 4/1990 | European Pat. Off. | |
| 0 385 466 A2 | 9/1990 | European Pat. Off. | |
| 0 413 863 A1 | 2/1991 | European Pat. Off. | G03F 3/10 |
| 0 437 015 A2 | 7/1991 | European Pat. Off. | |
| 0 601 760 A2 | 6/1994 | European Pat. Off. | |
| 0 643 332 | 3/1995 | European Pat. Off. | G06F 3/10 |
| 41 25 723 A1 | 2/1993 | Germany | G03F 7/027 |
| 5-142411 | 6/1993 | Japan | |
| 5-188591 | 7/1993 | Japan | |
| 6-67421 | 3/1994 | Japan | |
| 6-194514 | 7/1994 | Japan | |
| 7-102176 | 4/1995 | Japan | |
| 2 129 952 | 5/1984 | United Kingdom | |
| WO 93/03928 | 3/1993 | WIPO | |
| WO 93/15438 | 8/1993 | WIPO | G03F 3/10 |
| WO 96/10215 | 4/1996 | WIPO | |
| WO 96/10216 | 4/1996 | WIPO | |

OTHER PUBLICATIONS

Research Disclosure, vol. 222, pp. 328–329.
Choi, J.H., "Effect of Mechanical Factors on Resolution and Peel Force in a Peel–Aparat Imaging Film," *Journal of Imaging Technology*, vol. 15, No. 4, pp. 190–195(Aug. 1989).
Froehlich, H.H., "Eurosprit Proofing System," *SPIE*, vol. 1458, pp. 51–60 (1991).

*Primary Examiner*—John S. Chu
*Attorney, Agent, or Firm*—William D. Miller

[57] ABSTRACT

A process is described for the formation of a color image on a substrate comprising the steps of:

a) providing a donor element comprising element comprises a carrier substrate, color containing photohardenable layer, and photopolymerizable adhesive layer in which the unexposed photopolymer has a viscosity at 25° C. of less than 100,000 cps, b) adhering said photopolymer adhesive layer to a first substrate, c) irradiating said photopolymer adhesive in an imagewise distribution of radiation to polymerize said adhesive in an imagewise distribution, and d) stripping said element from said first substrate leaving an imagewise distribution of said color containing layer secured to said substrate. This process can be used to form any type of color image and is particularly useful in the formation of color proofs. Both positive and negative images can be provided, a positive image on the element and a negative image on the substrate.

21 Claims, No Drawings

DRY PEEL-APART IMAGING OR PROOFING SYSTEM

BACKGROUND OF THE INVENTION

1. Field of the Invention

The present invention relates to the formation of color images and sets of color images which may be high contrast images including black images on substrates by dry peal-apart imaging processes. Of particular importance to the practice of the present invention is the fabrication of a three or four color image (cyan, yellow, magenta and optional black) on a transparent substrate, particularly in a process for generating a pre-press color proofing image for the printing industry.

2. Background of the Art

In color reproduction, the color accuracy of graphic art color separation negatives are generally verified using color proofing systems prior to making the corresponding printing plates. The color proofing systems must provide a consistent representation of the final color print. It is well known in the art that the halftone dot retention plays a significant role in the color rendition of the final image. Slight changes in the dot reproduction curve can cause significant changes in visual color perception.

Several different types of color proofing systems are well known in the literature. Both digital and conventional proofing systems are available commercially. In digital systems, digitized data is used to directly image the color proofing materials. However, conventional proofing systems are primarily used when verifying the color accuracy of graphic art color separation films. Conventional color proofing systems consist of two types: overlay and surprint.

Overlay systems provide a convenient and quick way to visualize a representative color on a transparent substrate. A typical overlay film construction includes a polyester substrate and photosensitive color layer. Optional protective layers may also be included over the surface of the photosensitive color layer. A color proof is constructed by individually imaging and developing each representative color proofing film. The color imaged films are then laid upon each other in register on a paper stock. Even though this method provides a very simple way of combining two or more colors in registration, it has several inherent disadvantages. The multiplicity of plastic sheets cause incident light to internally reflect which imparts a gloss, color hue shift and a distortion of the final image. Antireflection coatings improve the visual perception of the proof; however, the presence of the thick polyester between each colored image still causes visual distortion of the final image. Examples of these types of constructions may be generally found in U.S. Pat. Nos. 3,136,637; 4,304,836; 4,482,625; 4,634,652; 4,748,101; 4,952,482; and 5,258,261.

A surprint proof is generated by successively superimposing different colored layers upon each other on a single sheet. The surprint color proofing materials are composed of two primary types: photosensitive precolored sheets and photosensitive colorless sheets whose latent image may be toned with pigments, inks or dyes. Some examples of post-colored proofing materials may be found in U.S. Pat. Nos. 3,060,024; 3,634,087; and DE 3,336,431. In the photopolymer systems the image is generally weak and often requires a protective layer. The resultant color hue is also very user dependent due to the dependency upon color density control, lot to lot variation the colorants and dusting of the toners causing color contamination. The electrostatic systems require more sophisticated equipment and environmental control which can be very expensive.

Another example of a precolored proofing system includes photosensitive constructions that are imaged prior to lamination to the receptor or intermediate sheet. Representative examples of these types of systems are described in U.S. Pat. Nos. 4,482,625 and 4,304,836. These systems require the imaged films to be laminated in register which is dependent upon laminating speed and temperature, and dimensional stability of the film and receptor. The accuracy of the registration is limited to smaller format proofs due to the difficulty in retaining perfect alignment of images during the thermal lamination process. Even though the exposure times may be shorter in these systems, productivity is lost due to the difficulties in producing several small proofs on a single large sheet known as scatter proofing.

U.S. Pat. No. 3,671,236 describes a negative acting pre-sensitized color proofing element comprising a carrier sheet having a smooth release surface, a diazo sensitized color layer and a non-photoactive barrier layer upon which may be coated a pressure sensitive adhesive or a thermal adhesive as described in U.S. Pat. No. 4,656,114. The developing media for this system is a 50:50 mixture of n-propanol and water. The barrier layer is present as a carrier for the image and to reduce interaction between the adhesive and the photoactive layer. U.S. Pat. Nos. 4,650,738; 4,751,166; 4,808,508; 4,929,532; and 5,008,174; EP 365,356 and EP 365,357 patent applications describe improvements on this construction by eliminating the need for a barrier layer between the diazo based photoactive layer and the adhesive. The developer used in these systems are aqueous alkali solutions containing greater than 3% surfactant.

U.S. Pat. No. 4,596,757 discloses a further improvement on the construction described in U.S. Pat. No. 3,671,236 by utilizing a photo monomer system in place of the diazonium binders. Again an aqueous alkali developer is used which contains high concentrations of a surfactant (the example cited used 8.5%).

U.S. Pat. No. 5,248,583 describes a construction which utilizes a photoactive color layer containing a photo-oligomer as the photopolymerizable component and a photopolymerizable barrier layer to provide a proofing element that can be developed in a low solids aqueous developer having a pH of 10.2. This construction allows one to develop the image using a more environmentally compatible effluent since the aqueous developer contains less caustic and less ingredients than those used in the previously described systems.

To achieve a system that is developable in a developing solution having a more neutral pH, the binders used in the photosensitive proofing formulation typically make the image more susceptible to attack by the developer. When the resistively developable image is swelled or attacked by the developer it becomes increasingly more difficult to hold the highlight dots (0.5–10% halftone dots) without sacrificing the shadow areas (90–99.5% halftone dots). The shadow areas are sacrificed when the photosensitive layer is over-exposed to achieve sufficient cross-link density in the highlight dots to resist developer attack. However, when a photosensitive layer is overexposed, the shadow areas begin to fill-in due to halation effects. This over-exposure also increases the overall dot gain, which significantly affects the color rendition. Therefore, there exists a need for a proofing system that maintains highlight halftone dots without over-exposure and is provided by thermal laser induced imaging processes which do not require adhesive layers on the donor elements.

One method of making colored images upon a non-photosensitive base uses laser induced colorant transfer or laser induced mask production. A donor element is induced (as by ablative levels of radiation) to transfer donor color material to a receptor surface. The donor may contain radiation or thermally sensitive materials to enhance the efficiency of transfer, or the donor material may be ablated without additional materials. Examples of this type of imaging process includes U.S. Pat. Nos. 5,156,938, 5,171,650, 5,256,506, and 5,089,372. The first three patents generally refer to producing a pattern of intelligence.

U.S. Pat. No. 5,171,650 discloses methods and materials for thermal imaging using an "ablation-transfer" technique. The donor element for that imaging process comprises a support, an intermediate dynamic release layer, and an ablative carrier topcoat. The topcoat carries the colorant. The dynamic release layer may also contain infrared-absorbing (light to heat conversion) dyes or pigments. The pigments also include black copper as an additive. Nitrocellulose is disclosed as a possible binder.

Copending U.S. application Ser. No. 07/855,799 discloses ablative imaging elements comprising a substrate coated on a portion thereof with an energy sensitive layer comprising a glycidyl azide polymer in combination with a radiation absorber. Demonstrated imaging sources included infrared, visible, and ultraviolet lasers. Solid state lasers were disclosed as exposure sources, although laser diodes were not specifically mentioned. This application is primarily concerned with the formation of relief printing plates and lithographic plates by ablation of the energy sensitive layer. No specific mention of utility for thermal mass transfer was made.

U.S. Pat. No. 5,308,737 discloses the use of black metal layers on polymeric substrates with gas-producing polymer layers which generate relatively high volumes of gas when irradiated. The black metal (e.g., aluminum) absorbs the radiation efficiently and converts it to heat for the gas-generating materials. It is observed in the examples that in some cases the black metal was eliminated from the substrate, leaving a positive image on the substrate.

U.S. Pat. No. 5,278,023 discloses laser-addressable thermal transfer materials for producing color proofs, printing plates, films, printed circuit boards, and other media. The materials contain a substrate coated thereon with a propellant layer wherein the propellant layer contains a material capable of producing nitrogen ($N_2$) gas at a temperature of preferably less than about 300° C.; a radiation absorber; and a thermal mass transfer material. The thermal mass transfer material may be incorporated into the propellant layer or in an additional layer coated onto the propellant layer. The radiation absorber may be employed in one of the above-disclosed layers or in a separate layer in order to achieve localized heating with an electromagnetic energy source, such as a laser. Upon laser induced heating, the transfer material is propelled to the receptor by the rapid expansion of gas. The thermal mass transfer material may contain, for example, pigments, toner particles, resins, metal particles, monomers, polymers, dyes, or combinations thereof. Also disclosed is a process for forming an image as well as an imaged article made thereby.

A series of patents (U.S. Pat. Nos. 4,965,242, 4,962,081, 4,975,410, 4,923,860, 5,073,534, and 5,166,126) have been assigned to Kodak disclosing the use of thermal dye diffusion transfer to make filter elements and color filter constructions. U.S. Pat. Nos. 4,965,242 and 5,073,534 teach the use of high $T_g$ polycarbonate and polyester receiving layers to accept the thermally transferred dye. With both receiving layers, a vaporous solvent treatment is required to drive the dye into the receiving layer.

WO 96/10215 (PCT/EP95/03423) describes a method for the formation of a negative color image comprising the following steps in order:
(A) providing a photosensitive element comprising a transparent support, a subbing layer, a photosensitive layer comprising (polymeric binder, colorant, photoinitiator system, and photopolymerizable ethylenically unsaturated monomer, with the weight ration of monomer/binder being at least 4:1), and an adhesive layer comprising a thermoplastic polymer with a Tg between 20° C. and 100° C.,
(B) either (i) providing a receiver base and laminating the receiver base at elevated temperature to the adhesive layer and then imagewise exposing the photosensitive layer, or (ii) imagewise exposing said photosensitive element to actinic radiation, and then providing a receiver base and laminating the receiver base at elevated temperature to the adhesive layer,
(C) peeling apart said transparent layer and said receiver base whereby the adhesive layer and the imagewise exposed areas of said photosensitive layer are transferred to the receiver base. Steps (A) through (C) may be repeated to provide multicolor images.

WO 96/10216 shows processes similar to those of WO 96/10215 except that by control of the monomer to binder ratio, either positive or negative images may be transferred to a receiver base.

UK Patent Application GB 2 129 952 A describes a peel imaging system comprising a first carrier sheet, a photopolymerizable layer (containing a non-attenuating, non-photosensitive dye or pigment and contains material which changes color when exposed to actinic radiation), and a second carrier sheet, at least the first carrier sheet being transparent or translucent, the photopolymerizable layer both polymerizing and changing color upon exposure to actinic radiation. After peeling apart of the carrier, the photopolymerizable material shears along the edges of the imaged areas so that exposed areas of the photopolymerizable layer remain on the first carrier sheet.

U.S. Pat. No. 4,288,525 describes a photosensitive material which may be used in peel-apart imaging processes, particularly in the formation of dry transfer materials, resist masks, printing plates and silk screen stencils. The imaging material consists of two carrier sheets which may be pealed apart and which are laminated together via at least two interlayers (a photosensitive layer and an image forming layer). Prior to exposure, if the carrier sheets are peeled apart, the carrier sheet adjacent the photosensitive layer separates wholly from it, leaving both photosensitive layer and image forming layer on the other carrier sheet. After exposure, if the sheets are peeled apart, the whole of the photosensitive layer and at least part of the image forming layer (according to its imagewise exposure) remains attached to the carrier sheet adjacent the photosensitive layer. By incorporating adhesive in or adjacent the shearable image forming layer, the photosensitive material may constitute a material from which dry transfers may be manufactured simply by exposure and peeling apart.

EPO Application No. EP 0 323 191 A2 describes a peel-apart imaging material useful in image transfer processes. The imaging material comprises a substrate and a photosensitive layer, the photosensitive layer (as two or more layers) comprising a dye or pigment and a photopolymerizable compound. The dye or pigment is contained in at least one of these two or more layers, but is absent from the layer in direct contact with the substrate. Upon imagewise exposure of the image forming material, the exposed and unexposed areas differ in their adhesion to a receptor and image transfer occurs through a breakaway separation within the layer in direct contact with the substrate.

WO 93/03928 describes peel-apart elements for laser induced thermal imaging processes, the elements comprising, in order, a support, an active layer (infrared absorbing material, and polymeric binder), an adhesive layer, and a cover sheet. The adhesive interrelationship between layers are such that upon peeling the layers apart, regions of the active layer exposed with infrared radiation adhere to the support while exposed regions adhere to the adhesive layer and the cover sheet, forming a negative image and a positive image on the respective sheets.

EPO Applications 0 096 572 A2; 0 385 466 A2; and 0 601 760 A2 and U.S. Pat. Nos. 4,050,936; 4,347,300; 4,291,114; 5,001,036; 5,234,790; 5,300,399; and 5,374,780 also describe peel-apart photosensitive imaging systems with adhesive layers.

Summary of the Invention

The present invention describes a method of fabricating a color image and particularly a color proofing image. In particular, donor elements and processes using those donor elements in the formation of color images including color proofs are manufactured by the materials and process of the present invention.

The donor element used in the practice of the present invention comprises in the following order:
a) a carrier layer, b) a pigmented color photohardenable layer (referred to herein as the "color" layer), c) a photopolymeric adhesive layer (referred to herein as an "Adhesive" layer), and an optionally preferred strippable liner layer. The viscosity of the unexposed photopolymer adhesive layer must be below 100,000 cps at 25° C. to avoid premature delamination of the color layer from the carrier layer.

The photopolymer adhesive layer is adhered to a receptor substrate, the adhesive is imagewise exposed to radiation to which the photosensitive layer is sensitive, by using the relatively low viscosity adhesive on the receptor sheet, a negative image is formed on the receptor which has high resolution and strong adherence to the receptor. Sharp lines of less than 40 micrometers in line width can be readily attained.

Detailed Description of the Invention

Color images usually require the application of at least three (cyan, yellow and magenta) colors and usually four colors (cyan, magenta, yellow and black) to form a full color printed image. In application imaging such as printing, each color must usually be deposited one at a time, the visual impact of the four colors being that of a natural image of virtually unlimited numbers of colors. Many different types of physical processes are used to generate such images, including gravure printing, lithographic printing, flexographic printing, relief printing, electrophotography, ink jet printing, bubble jet printing, thermal mass transfer, thermal dye transfer, peal-apart imaging, and other technologies. Each system has its own advantages and disadvantages, but most users today are striving for systems with reduced effluents and waste as both an environmental and cost consideration. Peal-apart imaging systems have a theoretic advantage in being dry developable (with no liquid effluent) and providing the possibility of production of negative and positive images simultaneously on opposite sheets. The present invention describes a peal-apart sheet which is capable of providing high resolution negative and positive images at the same time on separated sheets.

There are at least three layers used in the construction of the color peel-apart element used in the practice of the present invention. That element comprises a carrier substrate, appropriately (cyan, yellow, magenta or black, and even non-traditional colors such as metallic gold, silver, bronze and copper; fluorescent, pastel, red, blue, green, etc.) pigmented photohardenable (photopolymerizable) layer, and photopolymerizable adhesive layer.

Carrier Layer

The carrier layer comprises a flexible film layer, preferably a flexible organic polymeric film layer, more preferably a transparent/translucent organic polymeric film layer. Conventional polymeric film forming materials may be used in the selection of these carrier layers. such materials as polyesters (e.g., polyethyleneterephthalate, polyethylenenaphthalate), polycarbonates, polyimides, cellulosic films (e.g., cellulose triacetate, cellulose acetate butyrate), vinyl resins (e.g., vinyl chloride, vinylidene chloride) and the like may be used, with polyesters, and especially polyethylene terephthalate (PET) as the film material of choice.

Pigmented Photohardenable Layer

The pigmented photohardenable layer comprises an organic photohardenable binder with the appropriate pigment, and possibly even a combination of two or more (e.g., 2, 3, 4 or 5) pigments which absorb at wavelengths which produce a layer with the desired tone qualities for a matrix forming material. It is particularly desirable that the pigment containing layer, the color layer, have a transmission optical density (on the carrier layer, which is then transferred to the receptor layer) of at least 2.5 or 3.0, preferably more than 3.25, more preferably at least 3.5. The pigment may be any commercially available organic or inorganic pigment and may be mixed with dyes, and for black may be, for example, carbon black (alone or with other pigments to increase density or adjust the tone of the carbon black), metal/metal oxide mixtures, or more preferably, mixtures of two, three or four organic pigments which form a black pigmentation in the binder. Mixtures of metallic pigments and organic pigments may also be used. Mixtures of at least a) carbon black and two organic pigments or b) three organic pigments to form black are preferred in the practice of the present invention. Where the color pigmented layer is to be used as a color filter element, with the colors deposited between a black matrix (which may or may not be formed with a black imaging process of the present invention or formed by conventional or new processes), it is preferred that the color pigmented layer be transparent, using transparent pigments or a dispersion of pigments which allows sufficient visible radiation through the dispersion so that the color may be viewed by transmitted radiation.

The color layer may have a thickness between 5 and 100 micrometers, preferably between 5 and 50 micrometers, and more preferably between 6 and 40 micrometers, as long as the optical density of the layer is provided by the thickness and content of that layer. Preferred binder components of that layer are ethylenically unsaturated monomers, oligomers and polymers. Most preferable are the (meth)acryloyl polymerizable materials (with or without copolymerizable components). The (meth) indicating that the polymerizable materials may be methacrylic or acrylic materials. preferred polymerizable materials comprise at least some poly(meth) acryloyl materials with 2, 3, 4, 5, or six or more ethylenically unsaturated (meth)acryloyl groups on a monomer. Mixtures of (meth) acryloyl and copolymerizable materials may be used. Resins having a Tg between 30° C. and 150° C., including copolymers of acrylic and/or methacrylic monomers with styryl monomers may be used. Useful resins include polymers and copolymers of acrylic acid, methacrylic acid, methyl acrylate, ethylacrylate, methyl methacrylate, n-butyl methacrylate, n-butyl/isobutyl methacrylate, polyvinylacetates and polystyrenes. Latexes may also be used, but due to the presence of the emulsifiers there may be a tendency to attack the adjacent photosensitive layer, so special care in the selection must be taken. The styrene/acrylate resins having a Tg between 45° C. and 60° C. may form brittle films when formulated by themselves, so flexibilizers or the like may be desirable. These monomers may be blended with more highly functional materials such as the compounds of 4,249,011; 4,262,072; and 4,306,954 which are air stable (reduced oxygen sensitivity) acrylic substituted heterocyclic compounds including 1,3-bis[2,2,2-(triacryloyloxymethyl)ethoxy-2-hydroxypropyl]-5,5-dimethyl-2,4-imidizolidinedione (referred to as hydantoin hexaacrylate). Other additives or comonomers may include such materials as polyacrylic or polymethacrylic acid esters of polyhydric alcohols including for example di(meth) acrylic acid esters of aliphatic diols such as ethyleneglycol, triethyleneglycol, 2,2-dimethyl-1,3-propanediol, 1,3-cyclopentanediol, the tri(meth)acrylic esters of aliphatic triols such as glycerin, 1,2,3-propanetrimethanol, 1,2,5-pentanetriol, 1,3,6-hexanetriol, tetra(meth)acrylic esters of aliphatic triols such as 1,1,3,3-tetramethylolpropane and pentaerythritol tetraacrylate, and the penta- and hexa- counterparts of these compounds. "Color" layers in the practice of the present invention preferably exclude an imaged layer which is exclusively black. Although the final image may contain black pigments in certain areas or may have pigments which combine to form image areas which are black, to be a color image, there should be at least 5% of the final image area formed on the receptor which has visible color between the region of 410 to 700 nm which is not black.

Photopolymerizable Adhesive Layer

Polymerizable materials similar to those described for the pigmented photosensitive layer (the color layer) of the present invention may also be used within this layer as long as the viscosity of the layer is less than 100,000 cps at 25° C. The viscosity of this layer is measured by Brookfield viscosity or Haake rheometers.

The photosensitizers used within the photosensitive layers may be selected from amongst those photosensitizers well known within the photopolymerization and photoinitiation art and include, but are not limited to free radical photoinitiators such as diaryliodonium salts, triarylsulfonium salts, s-triazines, acyloin and derivatives thereof (e.g., benzoin, benzoin methyl ethers), diketones, such as benzil and diacetyl, phenones such as acetophenone, 2,2,2-tribromo-1-phenylethanone, 2,2-diethoxyacetophenone, benzophenone, and the like.

These and other non-limiting aspects of the present invention will be further described in the following examples.

One of the problems which needed to be addressed by the practice of the present invention is a result of the fact that NOA is thermally unstable, at least in part because it is a thermally curable system. Furthermore since NOA is a thiol-ene based photopolymer, it tends to interact with HHA (hydantoin hexaacrylate, as described in U.S. Pat. No. 4,323,591, compound 1) and therefore makes an NOA/HA mixture somewhat unstable. The earlier examples using NOA/HHA mixture for pigment dispersions and PP1 for the clear laminating photopolymer are satisfactory for establishing utility and for demonstrations, but are not the best combinations for commercialization of the technology. The colorant layer and adhesive layer coatings as well as the dispersions and solutions do not have adequate shelf life for significant product feasibility.

EBC materials used in the Examples are brand names of Radcure, UCB Chemicals, and include polyester acrylates (EBC 81, EBC 40, EBC 1810, EBC 80, and EBC 2870), Acrylated epoxies (EBC 605, EBC 3605, and EBC 3701), aliphatic urethanes (EBC 8402 and EBC 230) and polyacrylates (EBC 1701).

The following examples use other photopolymers to demonstrate that the concept of the present invention works for most photopolymers and that greater stability can be achieved. The important considerations for choosing the right photopolymers are (1). the photopolymer in the colorant layer has to have low adhesion to the PET carrier substrate after photocure, and (2). the photopolymer in the adhesive layer has to have the proper viscosity during the release liner peelaway and final peel-apart processes to prevent premature delamination or poor structure definition.

Photopolymer solution HHA* is obtained by mixing HHA (Hydantoin Hexaacrylate, 3M) with Irgacure™ 369 (ICI) photoinitiator in 10 to 0.25 ratio to a 10% solid solution in MEK. Pigment yellow 17 (Diarylide AAOA yellow), Pigment blue 15:3 (Phthalocyanine blue GS), pigment red 57:1 (Rubine) and carbon black (Regal 300R) are each dispersed in 1/1 ratio into portions of the photopolymer solution A with appropriate surfactants into the photopolymer solution. The surfactants used were Solsperse™ 17000 and 22000 (4 to 1 ratio) for cyan, Solsperse™ 17000 and 5000 for yellow, Solsperse™ 17000 only for magenta pigment and Solsperse™ 24000 and 5000 for black. Surfactant to pigment ratio was 10 to 1. The mixture was then ball milled with glass beads overnight to yield the four separate pigment color dispersions.

Unless otherwise specified, the materials and tools used are listed below.

Donor substrate: Plain 1 mil PET.

Receptor: sputter-etched PET films.

Photomask: 1. A Cr BM (Chromium Black Matrix) on 1.1 mm sodium lime glass made by IGI (Infinite Graphic Inc., MN) unless specified otherwise. The OD (reflection optical density) on the black field is 3.0. The Cr rectangles have areas of 70$\mu$×290$\mu$. They are separated in both horizontal and vertical direction by 40 $\mu$m.

2. A high contrast AgX Ugra resolution target film.
Exposure unit: Ascor 2 kW UV exposure printer which has a nominal power density of 57 mW/cm$^2$ at 0.369$\mu$.

EXAMPLE 1

Colorant layer: Pigment/HHA*, 1/1, 12% wt#4 Meyer bar. Cyan OD=1.2,

Magenta OD=1.1

Adhesive layer: [EBC3200/HHA, 1/1]/Irgacure 369, 10/0.5, 10% wt, #6.

Exposure time: Cyan; 13 seconds, Magenta; 5 seconds.

Results: Good edge definition was obtained for the black image for each color. The resolution is 12$\mu$, for both positive and negative fields print.

EXAMPLE 2

Colorant layer: same as Example 1, Cyan only.

Adhesive layer: [EBC1810/HHA, 1/1]/Irgacure 369, 10/0.25, 10% wt, #6.

Exposure time: Cyan; 11 seconds

Results: Good edge definition was obtained for the BM image for each color. The resolution is 12μ for both positive and negative fields print.

EXAMPLE 3

Colorant layer: Pigment/HHA*, 2/1, 12% wt#4 Meyer bar. Cyan OD=1.79,

Magenta OD=1.24, yellow; OD=0.8

Adhesive layer: [EBC3200/HHA, 1/1]/Irgacure 369, 10/0.25, 10% wt, #6.

Exposure time: Cyan; 35 seconds, Magenta; 2.2 seconds

BM mask3: A 0.9 mm sodium lime glass Samsung BM with 25μ linewidth was used.

Results: Good reproduction of the BM with excellent edge definition was obtained for the image of each color. The resolution is 12μ for both positive and negative fields print.

EXAMPLE 4

Colorant layer: Carbon black/HHA (with 1.25% Irgacure 369 to photopolymer), 1/1, 10.6% wt#4 Meyer bar. OD=1.05. The Carbon black/HHA, 2/1 mixture was ball milled overnight before subjected to a jet milling process at up to 20k lb/in$^2$ pressure. The dispersion was then passed through a 1μ filter.

Adhesive layer: [EBC3200/HHA, 1/1]/Irgacure 369, 10/0.25, 10% wt, #6.

Exposure time: 35 seconds.

BM mask3: A 0.9 mm sodium lime glass Samsung BM with 25μ linewidth was used.

Results: Good reproduction of the black image with excellent edge definition was obtained for the image of each color. The resolution is 12μ for both positive and negative fields print.

EXAMPLE 5

Colorant layer: 3-color Pigment black/HHA*, 18/7, 13.6% wt#6 Meyer bar. Pigment; Cyan/Magenta/Yellow, 5/5/4

Adhesive layer: [EBC3200/HHA, 1/1]/Irgacure™ 369, 10/0.25, 10% wt, #10.

Exposure time: 70 seconds using mask 3 (40 seconds with a Photronic quartz mask)

BM mask 3: A 0.9 mm sodium lime glass Samsung BM with 25μ linewidth was used.

BM mask 4: The Photronic mask, same as mask 1 except that the substrate is a 1.1 mm quartz plate.

Results: Good reproduction of the BM with excellent edge definition was obtained for the image of each color. The edge sharpness is within ±2μ.

EXAMPLE 6

Colorant layer: Carbon black /HHA*, 11/6.5 (Preparation same as example 4), 10.8% wt#4 Meyer bar. OD=1.55

Adhesive layer: HHA/Irgacure™ 369, 10/1, 10% wt, #6.

Exposure time: 5 seconds, using BM mask 4

Results: Good reproduction of the BM with excellent edge definition was obtained for the BM image of each color. The edge sharpness is within ±2μ.

EXAMPLE 7

Colorant layer: Carbon black/HHA, 3/1 [Regal 300R carbon black powder was sand mill-dispersed in toluene with 15% wt Solsperse™ 24000 and 3.75% wt Solsperse 5000 (to the pigment). The mixture was continuously sand milled for 2½ hours in an Eiger sand mill using zirconium/silicate sand. HAA* was then added to yield the right proportion], 10.8% wt#4 Meyer bar. OD=2.0.

Adhesive layer: (HHA/EBC40, 2/1)/Irgacure 369, 10/1, 10% wt, #6.

Exposure time: 6.5 seconds, using BM mask 4 using a 5kW Consolux™ exposure unit made by Burgess Industries, Inc. (Plymouth, Minn.).

Results: Good reproduction of the BM with excellent edge definition was obtained for the BM image of each color. The edge sharpness is within ±2μ.

EXAMPLE 8

Colorant layer: Green PG36/CN963A80*, 2/1 [PG36 green pigment was sand mill-dispersed in MEK with 6% wt Solsperse™ 28000 (to the pigment). The mixture was continuously sand milled for 2½ hours in an Eiger sand mill using zirconium/silicate sand. CN963A80* was then added to yield the right proportion], 10% wt#4 Meyer bar. OD=1.3

*CN963A80 is a blended photopolymer with 70–90% urethane acrylate oligomer and 10–30% Tripropylene Glycol Diacrylate by Sartomer Co., Inc. (Exton, Pa.).

Adhesive layer: (HHA/EBC40, 2/1)/Irgacure™ 369, 10/1, 10% wt, #6. Exposure time: 3 seconds, using a color filter (CF) quartz mask with 90μ, strip windows made by Photronic and using a 5 kW Consolux™ exposure unit made by Burgess Industries, Inc. (Plymouth, Minn.).

Results: Good reproduction of the color filter elements (strips) with excellent edge definition was obtained for the CFE image of each color. The edge sharpness is within ±1μ.

The curable adhesive layer maybe applied as liquid coating compositions which are dried to a sufficiently stable condition to allow movement of photopolymer to laminate to the receptor without extreme flow of the coating off of the carrier. The photopolymer layer maybe be in a solid state as in a dry film photoresist layer, which can be adhered to the receptor through lamination at modest temperatures, exposed through a mask at room temperature and peeled apart at slightly elevated temperature, at which the viscosity of the unexposed photopolymer is less than 70,000 cps.

In making full color images or images of more than one color, separate images (e.g., color separation images) of each color are laid down. The first sequences of process steps would comprise a process for the formation of a color image on a substrate comprising the steps of:

a) providing a donor element comprising element comprises a carrier substrate, color containing photohardenable layer, and photopolymerizable adhesive layer in which the unexposed photopolymer has a viscosity at 25° C. of less than 100,000 cps, b) adhering said photopolymer adhesive layer to a first substrate, c) irradiating said photopolymer adhesive in an imagewise distribution of radiation to polymerize said adhesive in an imagewise distribution, and d) stripping said element from said first substrate leaving an imagewise distribution of said color containing layer secured to said substrate.

Each color image is usually laid down by a process addressing that single color and then each subsequent color is laid down in successive steps. This process for multiple colors would progress by said color containing layer containing colorant which produces a first color, and then after step d) a second donor element is provided which comprises a carrier substrate, color containing photohardenable layer, and photopolymerizable adhesive layer in which the unexposed photopolymer has a viscosity at 25° C. of less than 100,000 cps, and where said color containing photohardenable layer of said second donor element has a second color which is different from said first color, and with said second donor element, steps b), c), d) and e) are repeated over said imagewise distribution of said first color containing layer secured to said substrate.

Likewise for three colors, the process would progress where after step d) with said second donor element, a third donor is provided which comprises a carrier substrate, color containing photohardenable layer, and photopolymerizable adhesive layer in which the unexposed photopolymer has a viscosity at 25° C. of less than 100,000 cps, and where said color containing photohardenable layer of said third donor element has a third color which is different from said first and second color, and with said third donor element, steps b), c), d) and e) are repeated over said imagewise distribution of said first and second color containing layers secured to said substrate.

Similarly for four colors, the process would be performed where after step d) with said third donor element, a fourth donor is provided which comprises a carrier substrate, color containing photohardenable layer, and photopolymerizable adhesive layer in which the unexposed photopolymer has a viscosity at 25° C. of less than 100,000 cps, and where said color containing photohardenable layer of said fourth donor element has a fourth color which is different from said first, second and third color, and with said fourth donor element, steps b), c), d) and e) are repeated over said imagewise distribution of said first, second and third color containing layers secured to said substrate.

EXAMPLE 9

This example is to demonstrate the importance of viscosity of PP1 and to set an upper limit of viscosity for our imaging application. No exposures were performed. The donor with colorant layer and various PP1 layer was peeled apart from the receptor right after lamination to determine whether pre-mature delamination took place. EBC is a brand name of Radcure, UCB Chemicals, Inc for its photochemical products.

| Photopolymer | Viscosity (cps) @ 25° C. | Premature De-lamination |
| --- | --- | --- |
| EBC 81 | 100 | No |
| EBC 40 | 175 | No |
| EBC 1810 | 550 | No |
| EBC 3200 | 2250 | No |
| EBC 80 | 3000 | No |
| EBC 605 | 7000 | No |
| EBC 8402 | 15000 | No |
| EBC 230 | 40000 | No |
| EBC 2870 | 70000 | No |
| EBC 3605 | 150000 | Yes |
| EBC 1701 | 560000 | Yes |
| EBC 3701 | >1 MM | Yes |

Colorant layer: Carbon black /HHA * (2.5% wt Irgacure 369 to the photopolymer), 3/1 [Regal 300R carbon black powder was sand mill-dispersed in Toluene with 15% wt Solsperse™ 24000 and 3.75% wt Solsperse™ 5000 (to the pigment). The mixture was continuously sand milled for 2½ hours in an Eiger sand mill using zirconium/silicate sand. HAA was then added to yield the right proportion], 10.8% wt#4 Meyer bar. OD=2.0

It is observed that 70,000 cps @ 25° C. is a marginal viscosity for the photosensitive adhesive layer for our peel-apart system before premature delamination takes place. The preferred maximum viscosity is estimated at below 100,000 cps, preferably below 90,000 cps, and more preferably below 80,000 cps at 25° C.

The curable PP1 (photosensitive adhesive) layer maybe applied as liquid coating compositions which are dried to a sufficiently stable condition to allow movement of photopolymer to laminate to the receptor without extreme flow of the coating off of the carrier. The photopolymer layer maybe be in a solid state as in a dry film photoresist layer, which can be adhered to the receptor through lamination at modest temperatures, exposed through a mask at room temperature and peeled apart at slightly elevated temperature, at which the viscosity of the unexposed photopolymer is less than 70,000 cps.

The process of the present invention may be alternatively practiced by coating the low viscosity photopolymerizable adhesive layer onto the final receptor surface and then dry laminating the pigment containing layer (with strippable carrier layer) onto the coated receptor. The imaging and stripping process of the present invention may then be performed. It is preferred in the practice of the present invention that the final image include color areas which are viewed as other than black.

EXAMPLE 10

Experimental results using photolithographic peel-apart technique and clear photopolymer.

Photopolymer solution A is obtained by mixing a NOA 81 optical grade, photocurable adhesive (Norland Products Inc.) with HHA solution* (Hydantoin Hexaacrylate/Irgacure 369, 10/0.5, 3M) in a 1/1 ratio to a 10% solid solution in MEK. Pigment yellow 17 (Diarylide AAOA yellow), Pigment blue 15:3 (Phthalocyanine blue GS) and pigment red 57:1 (Rubine) were mixed in 1/1/1 ratio with appropriate surfactants into the photopolymer solution such that the pigment/binder ratio was 1/1. The surfactants used were Solsperse 17000 and 22000 (4 to 1 ratio) for cyan, Solsperse 17000 and 5000 for yellow and 17000 only for magenta pigment. Surfactant to pigment ratio was 10 to 1. The mixture was then ball milled with glass beads overnight to yield the pigment black dispersion.

The mixture was then further diluted with Toluene/MEK (4/1) solvent to a 12% wt coated on a 1 mil PET using a #6 Meyer bar. The film was then oven dried for 1 minute at 80° C. after air drying at room temperature (RT). The photopolymer solution A was then used to overcoat the pigment/binder layer with a photopolymer layer using a #4 Meyer bar. The composite film was then air dried and oven dried again as before. The composite film was then cold laminated onto a 4 mil plain PET film (which served as a release liner) using a 3M 1147 laminator.

To simulate imaging on to an epoxy silane coated glass plate for actual black matrix application, a plasma etched PET film was used for demonstration. Before imaging, the 4 mil PET film on the laminated composite film was peeled away and the composite film was then relaminated onto the etched film. The rest of the element was subjected to exposure and peel-apart to generate a black matrix (hereinafter, "B" which is in effect a black image) on the etched film. The UV exposure was carried out using an ASCOR exposure unit which has a nominal UV intensity of 5.5 mW/cm². The exposure time was 130 seconds. The original "negative" mask is a Cr BM made by IGI (Infinite Graphic Inc., Minn.). The OD on the black field is 3.0. The Cr rectangles have areas of 70µ×290µ. They are separated in both the horizontal and vertical directions by 40 µm. The Black Matrix (BM) so generated has sharp edges at its windows. The irregularity at the edge is 1µ. The optical density on the black field is 1.0.

EXAMPLE 11

This example is similar to Example 10 except that the clear photopolymer solution was coated on a 4 mil PET release liner and then cold laminated onto the pigment/photopolymer layer on the donor substrate. The reason for this experiment was to eliminate scratches generated on the pigment layer in Example 10 during Meyer bar overcoating. In actual continuous coating when non-contact coating techniques are used where there are no relative motion between the web and coating head, such as gravure coating are used, process described in Example 10 is still viable and may be a preferred technique for donor coating.

EXAMPLE 12

Same as example 11 except that only a magenta dispersion was used as colorant layer. Magenta pigment had a better dispersion when Solsperse 3000 hyperdispersant was used as surfactant. The colorant layer was coated with 12% solid dispersion using a #4 Meyer bar. The clear photopolymer overcoat was made with 10% solution using #10 Meyer bar.

The receptor is a silane treated glass plate. A cleaned glass plate was dip-coated with a 5% A187 solution in MEK (A187 is 3-Glycidoxypropyltrimethoxysilane) and blow dried to obtain a very thin coating. The glass plate was then oven dried at 80° C. for 3 minutes. The rest of the process is the same as in Example 11. Exposure time was only 3.7 seconds. This is due to the fact that magenta pigment does not absorb in the UV range. Good adhesion of magenta BM to the glass plate was obtained. The quality is similar to that of Example 10.

In the process of the present invention for the formation of a colored image on a substrate, one provides a donor element comprising a carrier substrate, a pigmented photohardenable layer, and photopolymerizable adhesive layer in which the unexposed photopolymer has a viscosity at 25° C. of less than 100,000 cps, then adheres said photopolymer adhesive layer to a first substrate, with subsequent irradiation of said photopolymer adhesive in an imagewise distribution of radiation to polymerize said adhesive in an imagewise distribution, and then stripping said element from said first substrate leaving an imagewise distribution of said pigmented layer secured to said substrate. This process leaves an identifiable footprint of the process. The final image comprises the receptor surface, with relief areas of cured adhesive layer and pigment layer, and in between these relief areas are areas of uncured (or subsequently cured) adhesive material in a thickness which is less than the thickness of the adhesive layer in the relief areas. This thinner region of adhesive (which is less than 75%, more usually less than 50%, and most often less than 25% the thickness of adhesive remaining underneath the pigmented layer imagewise distributed on said receptor) occurs because of the splitting of the liquid adhesive layer during the stripping process. In the last stripping step described in the process of this invention, the adhesive layer is thus split between the strippable (carrier layer) and the receptor surface.

The article produced by this process would be a colored image (the color dependent upon the color of the pigment) on a substrate comprising a substrate, an imagewise distribution of areas of cured photopolymerizable adhesive with a layer of pigmented polymer over each area of cured photopolymer adhesive, and uncured photopolymerizable adhesive having no pigmented material on its surface on said substrate between areas of pigmented polymer. The colored image would preferably have said uncured photopolymerizable adhesive with a thickness which is less than 75% of the thickness of said cured photopolymerizable adhesive.

EXAMPLE 13

This example shows the results of using photopolymerization peel-apart techniques and clear photopolymer.

Photopolymer solution A was obtained by mixing a NOA 81 optical grade, photocurable adhesive with the HHA (hydantoin hexaacrylate/Irgacure 369, 10/0/5, available from 3M) in a 1/1 ratio to 10% solid solution in methylethylketone.

Pigment yellow 17 (Diarylidide AAOA yellow) was mixed with Solsperse 17000 and 22000 (4:1 ratio) into the photopolymer solution A so that the pigment to binder ratio was 1/1. The surfactant to pigment ratio was ≠1/10. The mixture was then ball milled with glass beads overnight to yield the pigment yellow dispersion.

Pigment blue 15:3 (Phthalocyanine blue GS) was mixed with Solsperse 17000 and 5000 (4:1 ratio) into the photopolymer solution A so that the pigment to binder ratio was 1/1. The surfactant to pigment ratio was ≠1/10. The mixture was then ball milled with glass beads overnight to yield the pigment blue dispersion.

Pigment red 5/1 (Rubine) was mixed with Solsperse 17000 into the photopolymer solution A so that the pigment to binder ratio was 1/1. The surfactant to pigment ratio was ≠1/10. The mixture was then ball milled with glass beads overnight to yield the pigment magenta dispersion.

Each dispersion was then further diluted with toluene/MEK (4/1) solvent to a 12 wt % dispersion and coated on a 0.0254 mm (1 mil) polyester film using a #6 Meyer bar. The films were then oven dried for 1 minute at 80° C. and then air dried at room temperature (RT).

The photopolymer solution A was then used to coat a 0.11mm (4 mil) PET release liner using a #6 Meyer bar and then cold laminated onto the donor substrate to form a composite donor element. The composite donor elements were made corresponding to yellow, cyan and magenta colors.

A plasma etched PET film was used as a receptor for demonstration purposes. Before imaging, the 0.11 mm PET film on the laminated yellow composite element was peeled away and the composite film was relaminated onto the etched film. The rest of the exposure/peel-apart process to generate the yellow color separation image was then performed. The UV exposure was carried out with an ASCOR exposure unit with a nominal UV intensity of about 5.5W/cm². The exposure time was about 60 seconds. The steps were repeated for magenta and cyan colors to generate a composite color image on the same receptor which acted as the final single sheet color proof.

The original "negative" masks are a set of four color separations of high contrast AgX film. The optical density on the black field is approximately 2.5. The color proof image generated by this process displayed sharp dots, vivid color, high resolution and a glossy surface texture.

EXAMPLE 14

This example was the same as example 13 except that only a magenta dispersion was used as the color layer. The magenta pigment formed a better dispersion when Solsperse 3000 hyperdispersant was used as a surfactant. The colorant layer was coated as a 12% by weight solid dispersion using a #4 Meyer bar. The clear photopolymer overcoat was made with 10% solution A using a #10 Meyer bar.

The receptor was an etched PET (polyethyleneterephthalate) 0.11mm film. The rest of the process was the same as in Example 1. The exposure time was only 3.7 seconds. This is due to the fact that the magenta pigment does not absorb strongly at the UV exposure range. Good adhesion of the magenta negative to the plasma etched PET was obtained. The quality was similar to that of Example 1.

The peeled off donor substrate bearing the positive image of the mask was then laminated to a new etched PET film. Since the photopolymer layers had not yet been crosslinked, a blanket exposure of 5 seconds through the image (the carrier and the pigmented layer) fixed the new positive image to the new receptor after the donor was peeled away.

EXAMPLE 15

A donor similar to that in Example 2 was used. The mask used was a AgX high resolution Ugra scale, typically used for printing plate evaluation. At an exposure time of 3 seconds, the peeled-apart image showed a resolution line finer than 8 micrometers. This might not even be the optimum capability of the resolution of the system as the pigment dispersion had not been optimized.

What is claimed:

1. A process for the formation of a color image on a substrate comprising the steps of:
    a) providing a donor element comprising a carrier substrate, a color pigmented photohardenable layer, and photopolymerizable adhesive layer in which the unexposed photopolymerizable adhesive layer has a viscosity at 25° C. of less than 100,000 cps,
    b) adhering said photopolymer adhesive layer to a first substrate,
    c) irradiating said photopolymer adhesive in an imagewise distribution of radiation to polymerize said adhesive in an imagewise distribution, and
    d) stripping said element from said first substrate leaving an imagewise distribution of said color pigmented layer secured to said substrate.

2. The process of claim 1 wherein said imagewise distribution of said color pigmented layer corresponds to areas which have been irradiated by said imagewise distribution of radiation.

3. The process of claim 2 wherein the viscosity of said unexposed photopolymer is less than 90,000 cps at 25° C.

4. The process of claim 2 wherein the viscosity of said unexposed photopolymer is less than 80,000 cps at 25° C.

5. The process of claim 1 wherein after said element is stripped from said first substrate, said stripped element, which has a negative distribution of photopolymer adhesive of the imagewise distribution of said color pigmented layer adhered to said first substrate remaining on said element, is adhered to a second substrate by said negative distribution of photopolymer adhesive.

6. The process of claim 5 wherein said negative distribution of photopolymer adhesive adhered to said second substrate is irradiated to bond said negative distribution of photopolymer adhesive to said second substrate.

7. The process of claim 6 wherein said color pigmented layer is also adhered to said second substrate by said irradiating to bond said negative distribution of photopolymer.

8. The process of claim 1 wherein said photopolymer adhesive layer comprises a multiacrylic functional monomer with at least two acrylic functionalities per molecule.

9. The process of claim 5 wherein said photopolymer adhesive layer comprises a multiacrylic functional monomer with at least two acrylic functionalities per molecule.

10. The process of claim 5 wherein said imagewise distribution of said color pigmented layer corresponds to areas which have been irradiated by said imagewise distribution of radiation.

11. The process of claim 5 wherein the viscosity of said unexposed photopolymer is less than 90,000 cps at 25° C.

12. The process of claim 5 wherein the viscosity of said unexposed photopolymer is less than 80,000 cps at 25° C.

13. A process for the formation of a color image on a substrate comprising the steps of:
    a) providing a donor element comprising a carrier substrate, a color pigmented photohardenable layer, and photopolymerizable adhesive layer in which the unexposed photopolymerizable adhesive layer has a viscosity at 25° C. of less than 100,000 cps,
    b) adhering said photopolymer adhesive layer to a first substrate,
    c) irradiating said photopolymer adhesive in an imagewise distribution of radiation to polymerize said adhesive in an imagewise distribution, and
    d) stripping said element from said first substrate leaving an imagewise distribution of said color pigmented layer secured to said substrate, with photopolymerizable adhesive remaining in areas of said first substrate between said imagewise distribution of said color pigmented layer.

14. The process of claim 13 wherein said photopolymerizable adhesive remaining in areas has a thickness which is less than the thickness of adhesive underneath said imagewise distribution of said color pigmented layer.

15. The process of claim 13 wherein said photopolymerizable adhesive remaining in areas has a thickness which is less than 75% of the thickness of adhesive underneath said imagewise distribution of said color pigmented layer.

16. The process of claim 1 wherein at least a second donor element is used in repeating steps a), b), c) and d) to form an imagewise distribution of at least two colors after repeating steps a), b), c) and d).

17. The process of claim 13 wherein at least a second donor element is used in repeating steps a), b), c) and d) to form an imagewise distribution of at least two colors after repeating steps a), b), c) and d).

18. A process for the formation of a color image on a substrate comprising the steps of:
    a) providing a donor element comprising a color pigmented photohardenable layer and a carrier layer,
    b) adhering the donor element to a receptor surface via a photopolymerizable adhesive layer in which the unexposed photopolymerizable adhesive layer has a viscosity at 25° C. of less than 100,000 cps,
    c) irradiating said photopolymerizable adhesive in an imagewise distribution of radiation to polymerize said adhesive in an imagewise distribution, and d) stripping said carrier layer from said receptor leaving an imagewise distribution of said color pigmented layer with the polymerized adhesive underneath said imagewise distribution of said color pigmented layer secured to said receptor.

19. The process of claim 18 wherein said imagewise distribution of radiation corresponds to data which is color separation information, and said imagewise distribution of said color pigmented layer corresponds to a color proof for a color represented by said pigment.

20. The process of claim 18 wherein said pigmented layer is a transparent pigmented layer, and said imagewise distribution of said color pigmented layer is a color layer in a color filter element.

21. The process of claim 5 wherein at least a second donor element is used in repeating steps a), b), c) and d) to form an imagewise distribution of at least two colors after repeating steps a), b), c) and d).

* * * * *